(12) United States Patent
Lin et al.

(10) Patent No.: US 8,284,891 B2
(45) Date of Patent: Oct. 9, 2012

(54) SHIFT REGISTER CIRCUIT

(75) Inventors: Chih-Ying Lin, Hsin-Chu (TW); Kun-Yueh Lin, Hsin-Chu (TW); Yu-Chung Yang, Hsin-Chu (TW); Kuo-Hua Hsu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/468,047

(22) Filed: May 10, 2012

(65) Prior Publication Data

US 2012/0219105 A1 Aug. 30, 2012

Related U.S. Application Data

(62) Division of application No. 12/959,378, filed on Dec. 3, 2010, now Pat. No. 8,204,170.

(30) Foreign Application Priority Data

Dec. 11, 2009 (TW) .............................. 98142479 A

(51) Int. Cl.
*G11C 19/00* (2006.01)
(52) U.S. Cl. ............................. 377/64; 377/78; 377/79
(58) Field of Classification Search .................. None
See application file for complete search history.

(56) References Cited

U.S. PATENT DOCUMENTS

| 5,222,082 | A | 6/1993 | Plus |
| 6,426,743 | B1 | 7/2002 | Yeo |
| 7,027,550 | B2 * | 4/2006 | Lin ................................ 377/64 |
| 7,233,308 | B2 | 6/2007 | Park |
| 7,289,096 | B2 | 10/2007 | Jeon |
| 7,528,820 | B2 | 5/2009 | Yoon |
| 8,130,189 | B2 * | 3/2012 | Xu et al. ......................... 345/92 |
| 2011/0058642 | A1 * | 3/2011 | Tsai et al. ....................... 377/79 |

* cited by examiner

*Primary Examiner* — Tuan T Lam
(74) *Attorney, Agent, or Firm* — Winston Hsu; Scott Margo

(57) ABSTRACT

A shift register circuit includes plural shift register stages for providing plural gate signals. Each shift register stage includes a pull-up unit, a pull-up control unit, an input unit, a first pull-down unit, a second pull-down unit, and a pull-down control unit. The pull-up control unit generates a first control signal according to a driving control voltage and a first clock. The pull-up unit pulls up a corresponding gate signal according to the first control signal. The input unit is utilized for inputting the gate signal of a preceding shift register stage to become the driving control voltage according to a second clock having a phase opposite to the first clock. The pull-down control unit generates a second control signal according to the driving control voltage. The first and second pull-down units pull down the corresponding gate signal and the first control signal respectively according to the second control signal.

7 Claims, 8 Drawing Sheets

SHIFT REGISTER CIRCUIT

CROSS REFERENCE TO RELATED APPLICATIONS

This division claims the benefit of U.S. application Ser. No. 12/959,378, which was filed on 2010 Dec. 3 and entitled "SHIFT REGISTER CIRCUIT" now U.S. Pat. No. 8,204,170.

BACKGROUND OF THE INVENTION

1. Field of the Invention

The present invention relates to a shift register circuit, and more particularly, to a shift register circuit adaptive for use in a liquid crystal display with low frame rate.

2. Description of the Prior Art

Along with the advantages of thin appearance, low power consumption, and low radiation, liquid crystal displays (LCDs) have been widely applied in various electronic products for panel displaying. The operation of a liquid crystal display is featured by modulating voltage drops between opposite sides of a liquid crystal layer for twisting the angles of the liquid crystal molecules in the liquid crystal layer so that the transmittance of the liquid crystal layer can be controlled for illustrating images with the aid of light source provided by a backlight module. In general, the liquid crystal display comprises plural pixel units, a shift register circuit, and a source driver. The source driver is utilized for providing plural data signals to be written into the pixel units. The shift register circuit comprises a plurality of shift register stages and functions to generate plural gate signals for controlling the operations of writing the data signals into the pixel units. That is, the shift register circuit is a crucial device for providing a control of writing the data signals into the pixel units.

FIG. 1 is a schematic diagram showing a prior-art shift register circuit. As shown in FIG. 1, the shift register circuit 100 comprises a plurality of shift register stages and, for ease of explanation, illustrates an (N−1)th shift register stage 111, an Nth shift register stage 112 and an (N+1)th shift register stage 113. Each shift register stage is employed to generate one corresponding gate signal furnished to one corresponding gate line based on a first clock CK1 and a second clock CK2 having a phase opposite to the first clock CK1. For instance, the (N−1)th shift register stage 111 is employed to generate a gate signal SGn−1 furnished to a gate line GLn−1, the Nth shift register stage 112 is employed to generate a gate signal SGn furnished to a gate line GLn, and the (N+1)th shift register stage 113 is employed to generate a gate signal SGn+1 furnished to a gate line GLn+1. The Nth shift register stage 112 comprises a pull-up unit 120, an input unit 130, an energy-store unit 125, a discharging unit 140, a pull-down unit 150 and a control unit 160. The pull-up unit 120 pulls up the gate signal SGn according to a driving control voltage VQn. The discharging unit 140 and the pull-down unit 150 are employed to pull down the driving control voltage VQn and the gate signal SGn respectively according to a pull-down control signal Sdn generated by the control unit 160.

In the operation of the shift register circuit 100, when the driving control voltage VQn retains low-level voltage, the gate signal SGn is supposed to continuously hold low-level voltage. However, because of a capacitive coupling effect caused by the device capacitor of the pull-up unit 120, the rising and falling edges of the first clock CK1 have an effect on the driving control voltage VQn and the gate signal SGn. The driving control voltage VQn affected is likely to incur improper operations of the pull-up unit 120, which results in the level drifting phenomena of the gate signal SGn and degrades image display quality.

SUMMARY OF THE INVENTION

In accordance with one embodiment of the present invention, a shift register circuit is provided for providing plural gate signals to plural gate lines. The shift register circuit comprises a plurality of shift register stages. And an Nth shift register stage of the shift register stages comprises a pull-up unit, a pull-up control unit, an input unit, an energy-store unit, a first pull-down unit, a pull-down control unit, and a second pull-down unit.

The pull-up unit, electrically connected to an Nth gate line of the gate lines, is utilized for pulling up an Nth gate signal of the gate signals according to a first control signal and a high power voltage. The pull-up control unit, electrically connected to the pull-up unit, is utilized for generating the first control signal according to a driving control voltage and a first clock. The input unit, electrically connected to the pull-up control unit and an (N−1)th shift register stage of the shift register stages, is put in use for inputting an (N−1)th gate signal of the gate signals to become the driving control voltage according to an input control signal. The energy-store unit, electrically connected to the pull-up control unit and the input unit, is employed to perform a charging process or a discharging process based on the (N−1)th gate signal. The first pull-down unit, electrically connected to the Nth gate line and the pull-up unit, is utilized for pulling down the Nth gate signal according to a second control signal. The pull-down control unit, electrically connected to the input unit, the first pull-down unit and the second pull-down unit, is utilized for generating the second control signal according to the driving control voltage and the high power voltage. The second pull-down unit, electrically connected to the pull-down control unit and the pull-up control unit, is utilized for pulling down the first control signal according to the second control signal.

In accordance with another embodiment of the present invention, a shift register circuit is provided for providing plural gate signals to plural gate lines. The shift register circuit comprises a plurality of shift register stages. And an Nth shift register stage of the shift register stages comprises a pull-up unit, a pull-up control unit, a first clock input unit, an input unit, an input control unit, a second clock input unit, an energy-store unit, a first pull-down unit, a pull-down control unit, and a second pull-down unit.

The pull-up unit, electrically connected to an Nth gate line of the gate lines, is utilized for pulling up an Nth gate signal of the gate signals according to a first control signal and a low-frequency clock. The pull-up control unit, electrically connected to the pull-up unit, is utilized for generating the first control signal according to a driving control voltage and a first clock. The first clock input unit, electrically connected to the pull-up control unit, is utilized for inputting the first clock to the pull-up control unit according to the low-frequency clock. The input unit, electrically connected to the pull-up control unit and an (N−1)th shift register stage of the shift register stages, is put in use for inputting an (N−1)th gate signal of the gate signals to become the driving control voltage according to an input control signal. The input control unit, electrically connected to the input unit, is utilized for inputting a second clock to become the input control signal according to the low-frequency clock. The phase of the second clock is opposite to that of the first clock. The second clock input unit, electrically connected to the input control unit, is utilized for inputting the second clock to the input control unit according to the low-frequency clock. The energy-store unit, electrically connected to the pull-up control unit and the input unit, is employed to perform a charging process or a discharging process based on the (N−1)th gate signal. The first pull-down unit, electrically connected to the Nth gate line and the pull-up unit, is utilized for pulling down the Nth gate signal according to a second control signal. The pull-down control unit, electrically connected to the input unit, the first pull-down unit and the second pull-down unit, is utilized for generating the second control signal according to the driving control voltage and the low-frequency clock. The second pull-down unit, electrically connected to the pull-down control unit and the pull-up control unit, is utilized for pulling down the first control signal according to the second control signal.

In accordance with another embodiment of the present invention, a shift register circuit is provided for providing plural gate signals to plural gate lines. The shift register circuit comprises a plurality of shift register stages. And an Nth shift register stage of the shift register stages comprises a pull-up unit, a pull-up control unit, an input unit, an input control unit, an energy-store unit, a first pull-down unit, a second pull-down unit, a third pull-down unit, a first pull-down control unit and a second pull-down control unit.

The pull-up unit, electrically connected to an Nth gate line of the gate lines, is utilized for pulling up an Nth gate signal of the gate signals according to a first control signal and a low-frequency clock. The pull-up control unit, electrically connected to the pull-up unit, is utilized for generating the first control signal according to a driving control voltage and a first clock. The input unit, electrically connected to the pull-up control unit and an (N−1)th shift register stage of the shift register stages, is put in use for inputting an (N−1)th gate signal of the gate signals to become the driving control voltage according to an input control signal. The input control unit, electrically connected to the input unit, is utilized for inputting a second clock to become the input control signal according to the low-frequency clock, wherein the second clock has a phase opposite to the first clock. The energy-store unit, electrically connected to the pull-up control unit and the input unit, is employed to perform a charging process or a discharging process based on the (N−1)th gate signal. The first pull-down unit, electrically connected to the Nth gate line and an (N+1)th shift register stage of the shift register stages, is utilized for pulling down the Nth gate signal according to an (N+1)th gate signal of the gate signals. The second pull-down unit, electrically connected to the pull-up control unit, is utilized for pulling down the first control signal according to a second control signal. The first pull-down control unit, electrically connected to the input unit and the second pull-down unit, is utilized for generating the second control signal according to the driving control voltage and a first low-frequency clock. The third pull-down unit, electrically connected to the pull-up control unit, is utilized for pulling down the first control signal according to a third control signal. The second pull-down control unit, electrically connected to the input unit and the third pull-down unit, is utilized for generating the third control signal according to the driving control voltage and a second low-frequency clock having a phase opposite to the first low-frequency clock.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
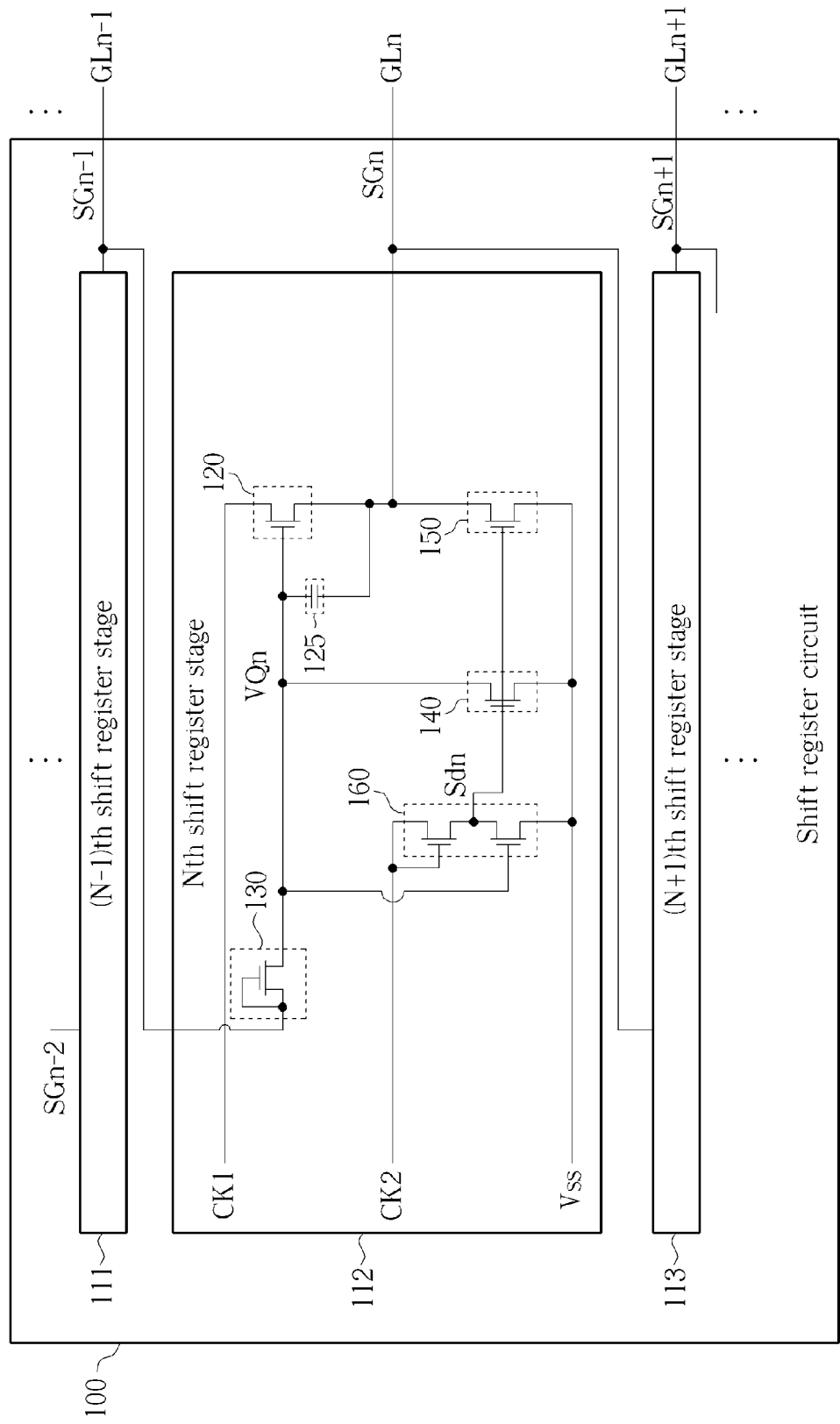
FIG. 1 is a schematic diagram showing a prior-art shift register circuit.
Figure 2:
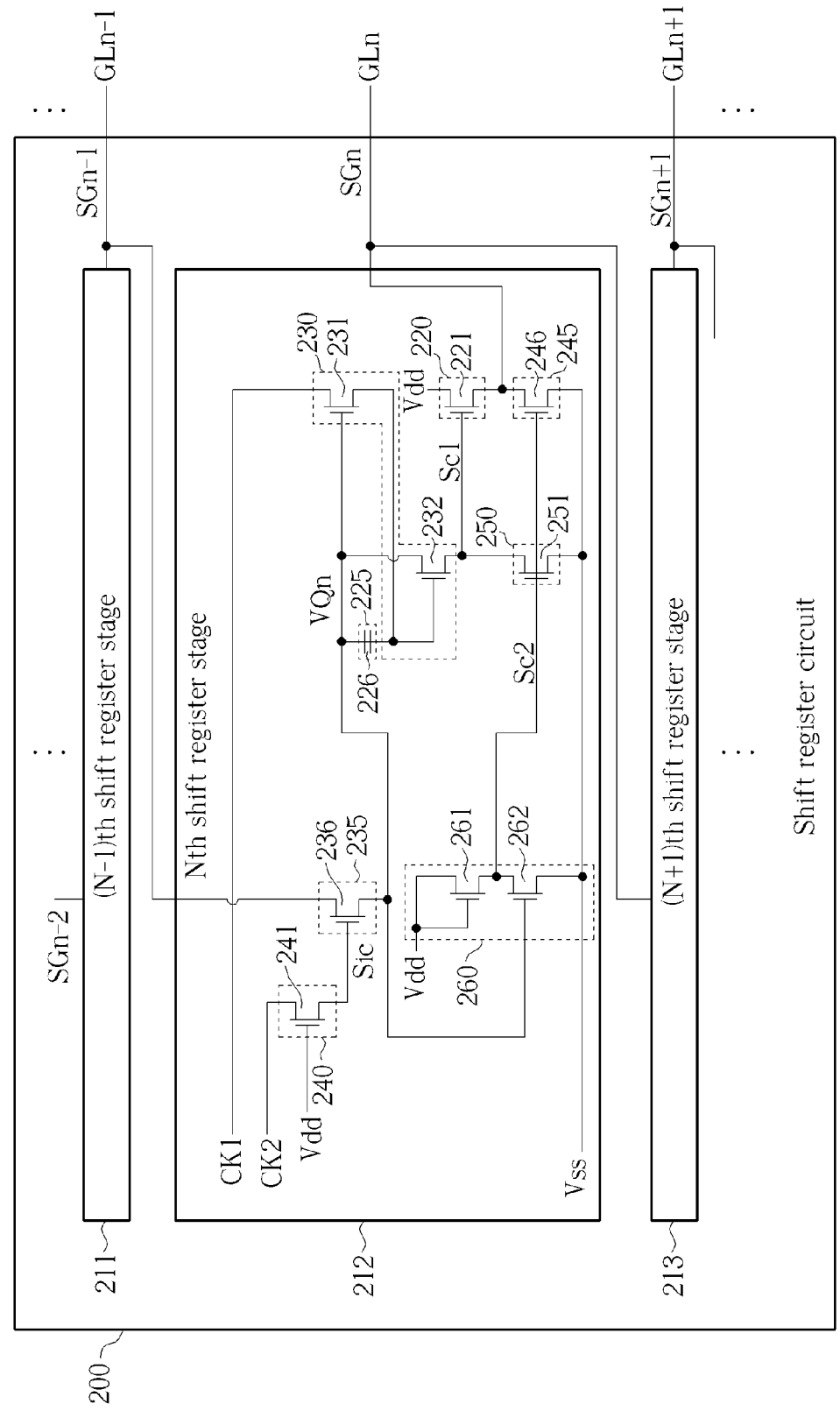
FIG. 2 is a schematic diagram showing a shift register circuit in accordance with a first embodiment of the present invention.

FIG. 2 is a schematic diagram showing a shift register circuit in accordance with a first embodiment of the present invention. As shown in FIG. 2, the shift register circuit 200 comprises a plurality of shift register stages and, for ease of explanation, illustrates an (N−1)th shift register stage 211, an Nth shift register stage 212 and an (N+1)th shift register stage 213. For the sake of brevity, only the internal structure of the Nth shift register stage 212 is exemplified in detail. The other shift register stages are similar to the Nth shift register stage 212 and can be inferred by analogy. In the operation of the shift register circuit 200, the (N−1)th shift register stage 211 is employed to generate a gate signal SGn−1 furnished to a gate line GLn−1, the Nth shift register stage 212 is employed to generate a gate signal SGn furnished to a gate line GLn, and the (N+1)th shift register stage 213 is employed to generate a gate signal SGn+1 furnished to a gate line GLn+1.

The Nth shift register stage 212 comprises a pull-up unit 220, a pull-up control unit 230, an input unit 235, an input control unit 240, an energy-store unit 225, a first pull-down unit 245, a second pull-down unit 250 and a pull-down control unit 260. The input control unit 240, electrically connected to the input unit 235, is utilized for inputting a second clock CK2 to become an input control signal Sic according to a high power voltage Vdd. The input unit 235, electrically connected to the (N−1)th shift register stage 211, is utilized for inputting the gate signal SGn−1 to become a driving control voltage VQn according to the input control signal Sic. That is, the gate signal SGn−1 also functions as a start pulse signal for enabling the Nth shift register stage 212. The pull-up control unit 230, electrically connected to the pull-up unit 220, the input unit 235 and the energy-store unit 225, is utilized for generating a first control signal Sc1 according to the driving control voltage VQn and a first clock CK1 having a phase opposite to the first clock CK2. The pull-up unit 220, electrically connected to the gate line GLn, is put in use for pulling up the gate signal SGn of the gate line GLn according to the first control signal Sc1 and the high power voltage Vdd. In another embodiment, the input control unit 240 is omitted, the second clock CK2 is furnished directly to the input unit 235, and therefore the input unit 235 inputs the gate signal SGn−1 to become the driving control voltage VQn according to the second clock CK2 directly.

The energy-store unit 225, electrically connected to the input unit 235 and the pull-up control unit 230, functions to perform a charging process or a discharging process based on the gate signal SGn−1. The energy-store unit 225 performs the charging process based on the gate signal SGn−1 when the input unit 235 inputs the gate signal SGn−1 having high-level voltage to become the driving control voltage VQn. The energy-store unit 225 performs the discharging process based on the gate signal SGn−1 when the input unit 235 inputs the gate signal SGn−1 having low-level voltage to become the driving control voltage VQn. For that reason, the aforementioned discharging unit in the prior art is not required to be disposed in the shift register circuit 200 for the purpose of discharging the energy-store unit 225.

The first pull-down unit 245, electrically connected to the gate line GLn and the pull-down control unit 260, is utilized for pulling down the gate signal SGn according to a second control signal Sc2. The second pull-down unit 250, electrically connected to the pull-up control unit 230 and the pull-down control unit 260, is utilized for pulling down the first control signal Sc1 according to the second control signal Sc2. The pull-down control unit 260, electrically connected to the input unit 235, the first pull-down unit 245 and the second pull-down unit 250, is utilized for generating the second control signal Sc2 according to the driving control voltage VQn and the high power voltage Vdd.

In the embodiment shown in FIG. 2, the pull-up unit 220 comprises a first transistor 221, the pull-up control unit 230 comprises a second transistor 231 and a third transistor 232, the input unit 235 comprises a fourth transistor 236, the input control unit 240 comprises a fifth transistor 241, the energy-store unit 225 comprises a capacitor 226, the first pull-down unit 245 comprises a sixth transistor 246, the second pull-down unit 250 comprises a seventh transistor 251, and the pull-down control unit 260 comprises an eighth transistor 261 and a ninth transistor 262. The first transistor 221 through the ninth transistor 262 are thin film transistors. The third transistor 232 can be an amorphous-Si thin film transistor. The width/length ratio of the third transistor 232 is larger than that of the seventh transistor 251, i.e. the leakage current of the third transistor 232 is larger than that of the seventh transistor 251.

The first transistor 221 comprises a first end for receiving the high power voltage Vdd, a second end electrically connected to the gate line GLn, and a gate end electrically connected to the pull-up control unit 230. The second transistor 231 comprises a first end for receiving the first clock CK1, a gate end electrically connected to the input unit 235 for receiving the driving control voltage VQn, and a second end. The capacitor 226 is electrically connected between the gate and second ends of the second transistor 231. The third transistor 232 comprises a first end electrically connected to the gate end of the second transistor 231, a second end electrically connected to the gate end of the first transistor 221, and a gate end electrically connected to the second end of the second transistor 231. The fourth transistor 236 comprises a first end electrically connected to the (N−1)th shift register stage 211 for receiving the gate signal SGn−1, a second end electrically connected to the gate end of the second transistor 231, and a gate end electrically connected to the input control unit 240 for receiving the input control signal Sic. The fifth transistor 241 comprises a first end for receiving the second clock CK2, a second end electrically connected to the gate end of the fourth transistor 236, and a gate end for receiving the high power voltage Vdd.

The sixth transistor 246 comprises a first end electrically connected to the gate line GLn, a second end for receiving a low power voltage Vss, and a gate end electrically connected to the pull-down control unit 260 for receiving the second control signal Sc2. The seventh transistor 251 comprises a first end electrically connected to the second end of the third transistor 232, a second end for receiving the low power voltage Vss, and a gate end electrically connected to the pull-down control unit 260 for receiving the second control signal Sc2. The eighth transistor 261 comprises a first end for receiving the high power voltage Vdd, a gate end electrically connected to the first end, and a second end electrically connected to the gate ends of the sixth transistor 246 and the seventh transistor 251. The ninth transistor 262 comprises a first end electrically connected to the second end of the eighth transistor 261, a second end for receiving the low power voltage Vss, and a gate end electrically connected to the second end of the fourth transistor 236 for receiving the driving control voltage VQn.

Figure 3:
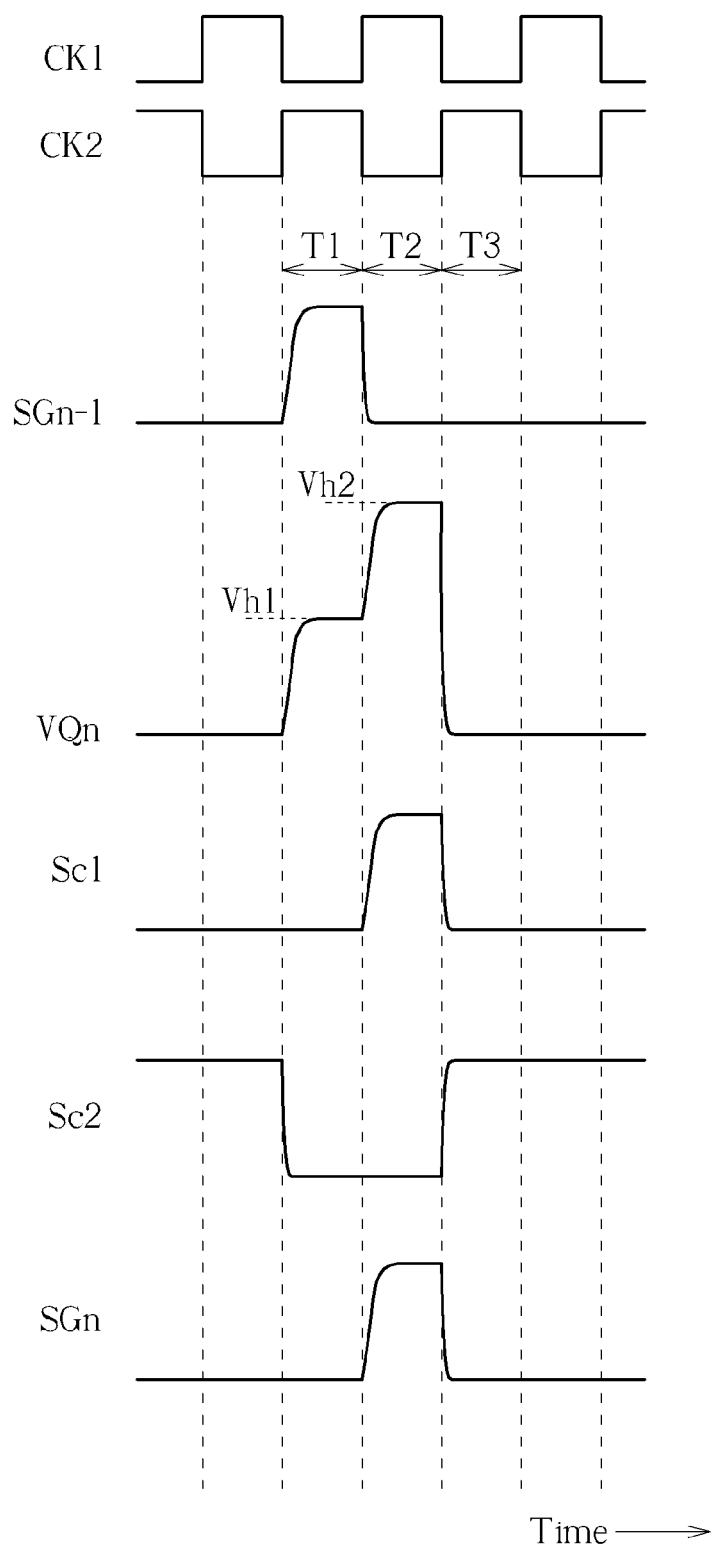
FIG. 3 is a schematic diagram showing related signal waveforms regarding the operation of the shift register circuit in FIG. 2, having time along the abscissa.

FIG. 3 is a schematic diagram showing related signal waveforms regarding the operation of the shift register circuit 200 in FIG. 2, having time along the abscissa. The signal waveforms in FIG. 3, from top to bottom, are the first clock CK1, the second clock CK2, the gate signal SGn−1, the driving control voltage VQn, the first control signal Sc1, the second control signal Sc2, and the gate signal SGn. As shown in FIG. 3, during an interval T1, the second clock CK2 is switching from low-level voltage to high-level voltage, and therefore the input control signal Sic is shifting up to high-level voltage for turning on the fourth transistor 236. In the meantime, since the gate signal SGn−1 is shifting from low-level voltage to high-level voltage, the driving control voltage VQn is then shifting from low-level voltage to a first high voltage Vh1 via a charging process of the capacitor 226. Accordingly, the second transistor 231 and the ninth transistor 262 are turned on and, in turn, the second control signal Sc2 is pulled down to the low power voltage Vss for turning off the sixth transistor 246 and the seventh transistor 251.

During an interval T2, the second clock CK2 is switching from high-level voltage to low-level voltage, and the input control signal Sic is then shifting down to low-level voltage. Consequently, the fourth transistor 236 is turned off and the driving control voltage VQn becomes a floating voltage. Although the gate signal SGn−1 is shifting from high-level voltage to low-level voltage during the interval T2, the low-level voltage of the gate signal SGn−1 cannot be inputted to become the driving control voltage VQn via the fourth transistor 236. Concurrently, along with the switching of the first clock CK1 from low-level voltage to high-level voltage, the driving control voltage VQn is further boosted from the first high voltage Vh1 to a second high voltage Vh2 due to a coupling effect of the capacitor 226. Accordingly, the second transistor 231 and the ninth transistor 262 are continuously turned on. Because the third transistor 232 is a thin film transistor having larger width/length ratio than the seventh transistor 251 as aforementioned, the first control signal Sc1 can be boosted up to high-level voltage following the increase of the driving control voltage VQn to the second high voltage Vh2 based on the leakage current of the third transistor 232 regardless of the fact that the third transistor 232 is turned off by the voltage drop of the capacitor 226. For that reason, the first transistor 221 is turned on for pulling up the gate signal SGn from low-level voltage to the high power voltage Vdd.

During an interval T3, the second clock CK2 is switching from low-level voltage to high-level voltage, and therefore the input control signal Sic is shifting up to high-level voltage for turning on the fourth transistor 236. Meanwhile, since the gate signal SGn−1 has already been retained to low-level voltage, the driving control voltage VQn is then shifting from the second high voltage Vh2 to low-level voltage via a discharging process of the capacitor 226. Accordingly, the second transistor 231 and the ninth transistor 262 are turned off. In view of that, the second control signal Sc2 can be pulled up to the high power voltage Vdd via the eighth transistor 261. Consequently, the sixth transistor 246 and the seventh transistor 251 are turned on for pulling down the first control signal Sc1 and the gate signal SGn to the low power voltage Vss. Thereafter, as long as the gate signal SGn continues holding low-level voltage, although the rising and falling edges of the first clock CK1 have an effect on the voltage level of the driving control voltage VQn, the driving control voltage VQn is not employed directly to drive the first transistor 221 of the pull-up unit 220 and therefore the gate signal SGn can be stabilized to low-level voltage, i.e. the level drifting phenomena of the gate signals can be prevented, for improving image display quality.

In summary, through accumulating charges at the gate end of the first transistor 221 based on the leakage current of the third transistor 232, the first control signal Sc1 can be boosted to high-level voltage. However, the charge accumulating speed is limited by the leakage current which is significantly less than the turn-on current of a transistor. For that reason, the interval T2 is required to be long enough for accumulating sufficient charges to boost voltage. In other words, the frequency of the first clock CK1 and the second clock CK2 is quite limited and therefore the shift register circuit 200 is adaptive for use in a liquid crystal display with low frame rate such as the display panel installed in an electronic bookmark, an electronic book, and an electronic bulletin board, etc.

Figure 4:
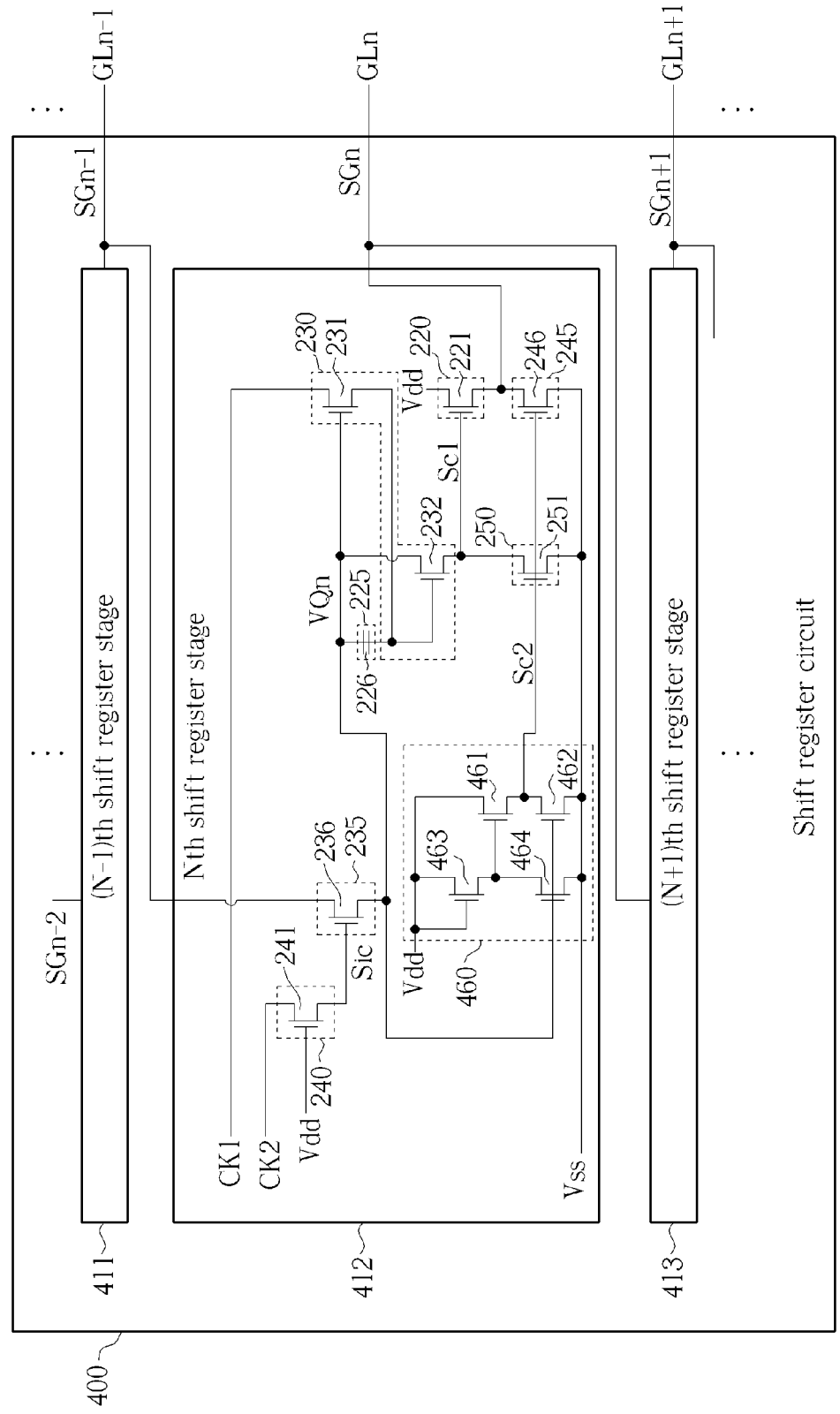
FIG. 4 is a schematic diagram showing a shift register circuit in accordance with a second embodiment of the present invention.

FIG. 4 is a schematic diagram showing a shift register circuit in accordance with a second embodiment of the present invention. As shown in FIG. 4, the shift register circuit 400 comprises a plurality of shift register stages and, for ease of explanation, illustrates an (N−1)th shift register stage 411, an Nth shift register stage 412 and an (N+1)th shift register stage 413. For the sake of brevity, only the internal structure of the Nth shift register stage 412 is exemplified in detail. The other shift register stages are similar to the Nth shift register stage 412 and can be inferred by analogy. The circuit structure of the Nth shift register stage 412 is similar to that of the Nth shift register stage 212 shown in FIG. 2, differing in that the pull-down control unit 260 is replaced with a pull-down control unit 460.

The pull-down control unit 460 comprises an eighth transistor 461, a ninth transistor 462, a tenth transistor 463 and an eleventh transistor 464. The eighth transistor 461 through the eleventh transistor 464 are thin film transistors. The eighth transistor 461 comprises a first end for receiving the high power voltage Vdd, a second end electrically connected to the gate ends of the sixth transistor 246 and the seventh transistor 251, and a gate end. The ninth transistor 462 comprises a first end electrically connected to the second end of the eighth transistor 461, a second end for receiving the low power voltage Vss, and a gate end electrically connected to the second end of the fourth transistor 236 for receiving the driving control voltage VQn.

The tenth transistor 463 comprises a first end for receiving the high power voltage Vdd, a gate end electrically connected to the first end, and a second end electrically connected to the gate end of the eighth transistor 461. The eleventh transistor 464 comprises a first end electrically connected to the second end of the tenth transistor 463, a second end for receiving the low power voltage Vss, and a gate end electrically connected to the second end of the fourth transistor 236 for receiving the driving control voltage VQn. The tenth transistor 463 is employed to forward the high power voltage Vdd to the gate end of the eighth transistor 461. The eleventh transistor 464 is utilized for pulling down the voltage at the gate end of the eighth transistor 461 according to the driving control voltage VQn. The signal waveforms regarding the operation of the shift register circuit 400 are substantially identical to the signal waveforms shown in FIG. 3 and, for the sake of brevity, further similar discussion thereof is omitted.

Figure 5:
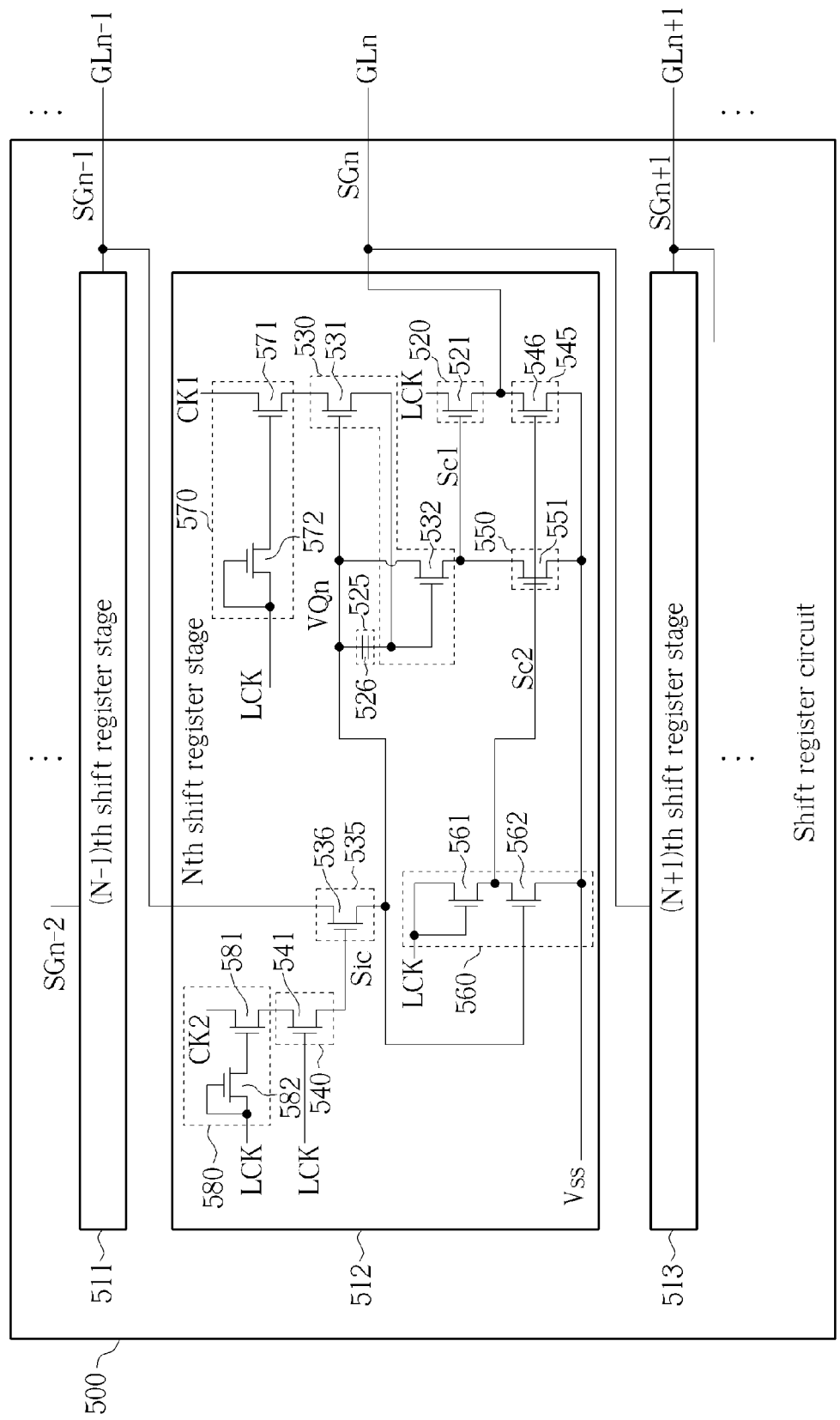
FIG. 5 is a schematic diagram showing a shift register circuit in accordance with a third embodiment of the present invention.

FIG. 5 is a schematic diagram showing a shift register circuit in accordance with a third embodiment of the present invention. As shown in FIG. 5, the shift register circuit 500 comprises a plurality of shift register stages and, for ease of explanation, illustrates an (N−1)th shift register stage 511, an Nth shift register stage 512 and an (N+1)th shift register stage 513. For the sake of brevity, only the internal structure of the Nth shift register stage 512 is exemplified in detail. The other shift register stages are similar to the Nth shift register stage 512 and can be inferred by analogy. In the operation of the shift register circuit 500, the (N−1)th shift register stage 511 is employed to generate a gate signal SGn−1 furnished to a gate line GLn−1, the Nth shift register stage 512 is employed to generate a gate signal SGn furnished to a gate line GLn, and the (N+1)th shift register stage 513 is employed to generate a gate signal SGn+1 furnished to a gate line GLn+1.

The Nth shift register stage 512 comprises a pull-up unit 520, a pull-up control unit 530, a first clock input unit 570, an input unit 535, an input control unit 540, a second clock input unit 580, an energy-store unit 525, a first pull-down unit 545, a second pull-down unit 550 and a pull-down control unit 560. The first clock input unit 570, electrically connected to the pull-up control unit 530, is utilized for inputting a first clock CK1 to the pull-up control unit 530 according to a low-frequency clock LCK. The frequency of the low-frequency clock LCK is less than that of the first clock CK1. The pull-up control unit 530, electrically connected to the pull-up unit 520, the input unit 535, the first clock input unit 570 and the energy-store unit 525, is utilized for generating a first control signal Sc1 according to a driving control voltage VQn and the first clock CK1. The pull-up unit 520, electrically connected to the gate line GLn, is put in use for pulling up the gate signal SGn of the gate line GLn according to the first control signal Sc1 and the low-frequency clock LCK.

The input unit 535, electrically connected to the (N−1)th shift register stage 511, is utilized for inputting the gate signal SGn−1 to become the driving control voltage VQn according to an input control signal Sic. That is, the gate signal SGn−1 also functions as a start pulse signal for enabling the Nth shift register stage 512. The input control unit 540, electrically connected to the input unit 535, is utilized for inputting a second clock CK2 to become the input control signal Sic according to the low-frequency clock LCK. The phase of the second clock CK2 is opposite to that of the first clock CK1. The second clock input unit 580, electrically connected to the input control unit 540, is utilized for inputting the second clock CK2 to the input control unit 540 according to the low-frequency clock LCK.

The energy-store unit 525, electrically connected to the input unit 535 and the pull-up control unit 530, functions to perform a charging process or a discharging process based on the gate signal SGn−1. The energy-store unit 525 performs the charging process based on the gate signal SGn−1 when the input unit 535 inputs the gate signal SGn−1 having high-level voltage to become the driving control voltage VQn. The energy-store unit 525 performs the discharging process based on the gate signal SGn−1 when the input unit 535 inputs the gate signal SGn−1 having low-level voltage to become the driving control voltage VQn. For that reason, the aforementioned discharging unit in the prior art is not required to be disposed in the shift register circuit 500 for the purpose of discharging the energy-store unit 525.

The first pull-down unit 545, electrically connected to the gate line GLn and the pull-down control unit 560, is utilized for pulling down the gate signal SGn according to the second control signal Sc2. The second pull-down unit 550, electrically connected to the pull-up control unit 530 and the pull-down control unit 560, is utilized for pulling down the first control signal Sc1 according to the second control signal Sc2. The pull-down control unit 560, electrically connected to the input unit 535, the first pull-down unit 545 and the second pull-down unit 550, is utilized for generating the second control signal Sc2 according to the driving control voltage VQn and the low-frequency clock LCK.

In the embodiment shown in FIG. 5, the pull-up unit 520 comprises a first transistor 521, the pull-up control unit 530 comprises a second transistor 531 and a third transistor 532, the input unit 535 comprises a fourth transistor 536, the input control unit 540 comprises a fifth transistor 541, the energy-store unit 525 comprises a capacitor 526, the first pull-down unit 545 comprises a sixth transistor 546, the second pull-down unit 550 comprises a seventh transistor 551, the pull-down control unit 560 comprises an eighth transistor 561 and a ninth transistor 562, the first clock input unit 570 comprises a tenth transistor 571 and an eleventh transistor 572, and the second clock input unit 580 comprises a twelfth transistor 581 and a thirteenth transistor 582. The first transistor 521 through the thirteenth transistor 582 are thin film transistors. The third transistor 532 can be an amorphous-Si thin film transistor. The width/length ratio of the third transistor 532 is larger than that of the seventh transistor 551, i.e. the leakage current of the third transistor 532 is larger than that of the seventh transistor 551.

The first transistor 521 comprises a first end for receiving the low-frequency clock LCK, a second end electrically connected to the gate line GLn, and a gate end electrically connected to the pull-up control unit 530. The second transistor 531 comprises a first end electrically connected to the first clock input unit 570, a gate end electrically connected to the input unit 535 for receiving the driving control voltage VQn, and a second end. The capacitor 526 is electrically connected between the gate and second ends of the second transistor 531. The third transistor 532 comprises a first end electrically connected to the gate end of the second transistor 531, a second end electrically connected to the gate end of the first transistor 521, and a gate end electrically connected to the second end of the second transistor 531. The fourth transistor 536 comprises a first end electrically connected to the (N−1)th shift register stage 511 for receiving the gate signal SGn−1, a second end electrically connected to the gate end of the second transistor 531, and a gate end electrically connected to the input control unit 540 for receiving the input control signal Sic. The fifth transistor 541 comprises a first end electrically connected to the second clock input unit 580, a second end electrically connected to the gate end of the fourth transistor 536, and a gate end for receiving the low-frequency clock LCK.

The sixth transistor 546 comprises a first end electrically connected to the gate line GLn, a second end for receiving the low power voltage Vss, and a gate end electrically connected to the pull-down control unit 560 for receiving the second control signal Sc2. The seventh transistor 551 comprises a first end electrically connected to the second end of the third transistor 532, a second end for receiving the low power voltage Vss, and a gate end electrically connected to the pull-down control unit 560 for receiving the second control signal Sc2. The eighth transistor 561 comprises a first end for receiving the low-frequency clock LCK, a gate end electrically connected to the first end, and a second end electrically connected to the gate ends of the sixth transistor 546 and the seventh transistor 551. The ninth transistor 562 comprises a first end electrically connected to the second end of the eighth transistor 561, a second end for receiving the low power voltage Vss, and a gate end electrically connected to the second end of the fourth transistor 536 for receiving the driving control voltage VQn.

The tenth transistor 571 comprises a first end for receiving the first clock CK1, a second end electrically connected to the first end of the second transistor 531, and a gate end. The eleventh transistor 572 comprises a first end for receiving the low-frequency clock LCK, a gate end electrically connected to the first end, and a second end electrically connected to the gate end of the tenth transistor 571. In another embodiment, the eleventh transistor 572 is omitted and the low-frequency clock LCK is furnished directly to the gate end of the tenth transistor 571. The twelfth transistor 581 comprises a first end for receiving the second clock CK2, a second end electrically connected to the first end of the fifth transistor 541, and a gate end. The thirteenth transistor 582 comprises a first end for receiving the low-frequency clock LCK, a gate end electrically connected to the first end, and a second end electrically connected to the gate end of the twelfth transistor 581. In another embodiment, the thirteenth transistor 582 is omitted and the low-frequency clock LCK is furnished directly to the gate end of the twelfth transistor 581.

Figure 6:
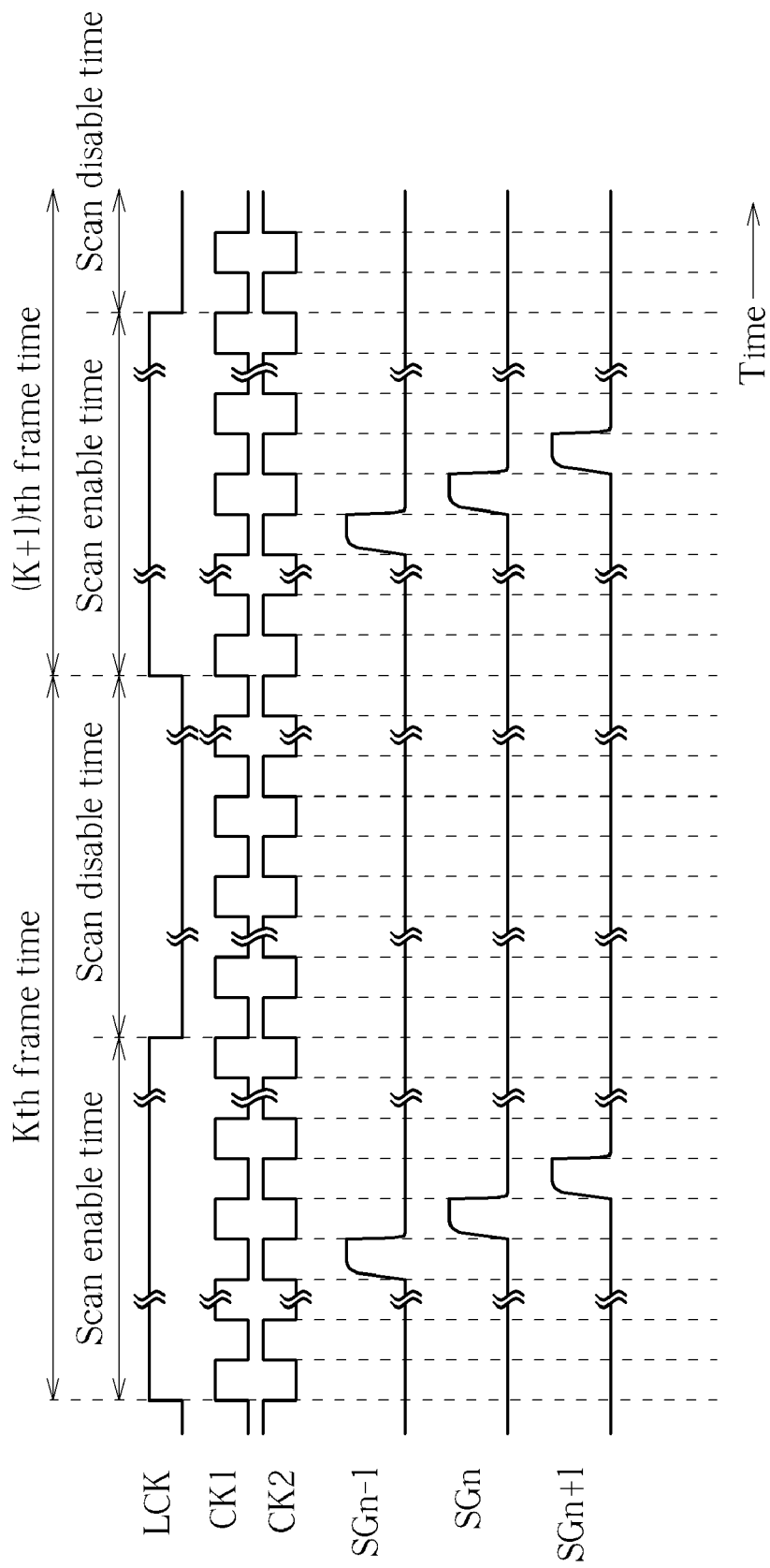
FIG. 6 is a schematic diagram showing related signal waveforms regarding the operation of the shift register circuit in FIG. 5, having time along the abscissa.

FIG. 6 is a schematic diagram showing related signal waveforms regarding the operation of the shift register circuit 500 in FIG. 5, having time along the abscissa. The signal waveforms in FIG. 6, from top to bottom, are the low-frequency clock LCK, the first clock CK1, the second clock CK2, the gate signal SGn−1, the gate signal SGn, and the gate signal SGn+1. As shown in FIG. 6, the Kth frame time includes a scan enable time and a scan disable time. And each of other frame times, e.g. the (K+1)th frame time, includes a corresponding scan enable time and a corresponding scan disable time. During the scan enable time of the Kth frame time, the low-frequency clock LCK holds high-level voltage so that the first clock input unit 570 is capable of inputting the first clock CK1 to the pull-up control unit 530, the second clock input unit 580 is capable of inputting the second clock CK2 to the input control unit 540, and the shift register circuit 500 is then enabled to provide plural gate signals for performing a scanning operation on plural gate lines. During the scan disable time of the Kth frame time, the low-frequency clock LCK holds low-level voltage so that the first clock CK1 cannot be forwarded to the pull-up control unit 530, the second clock CK2 cannot be forwarded to the input control unit 540, and the shift register circuit 500 is then disabled to suspend the circuit operation thereof. For that reason, the shift register circuit 500 dissipates almost zero power during the scan disable time. And by making use of the shift register circuit 500, the power consumption of liquid crystal displays with low frame rate can be reduced significantly.

Figure 7:
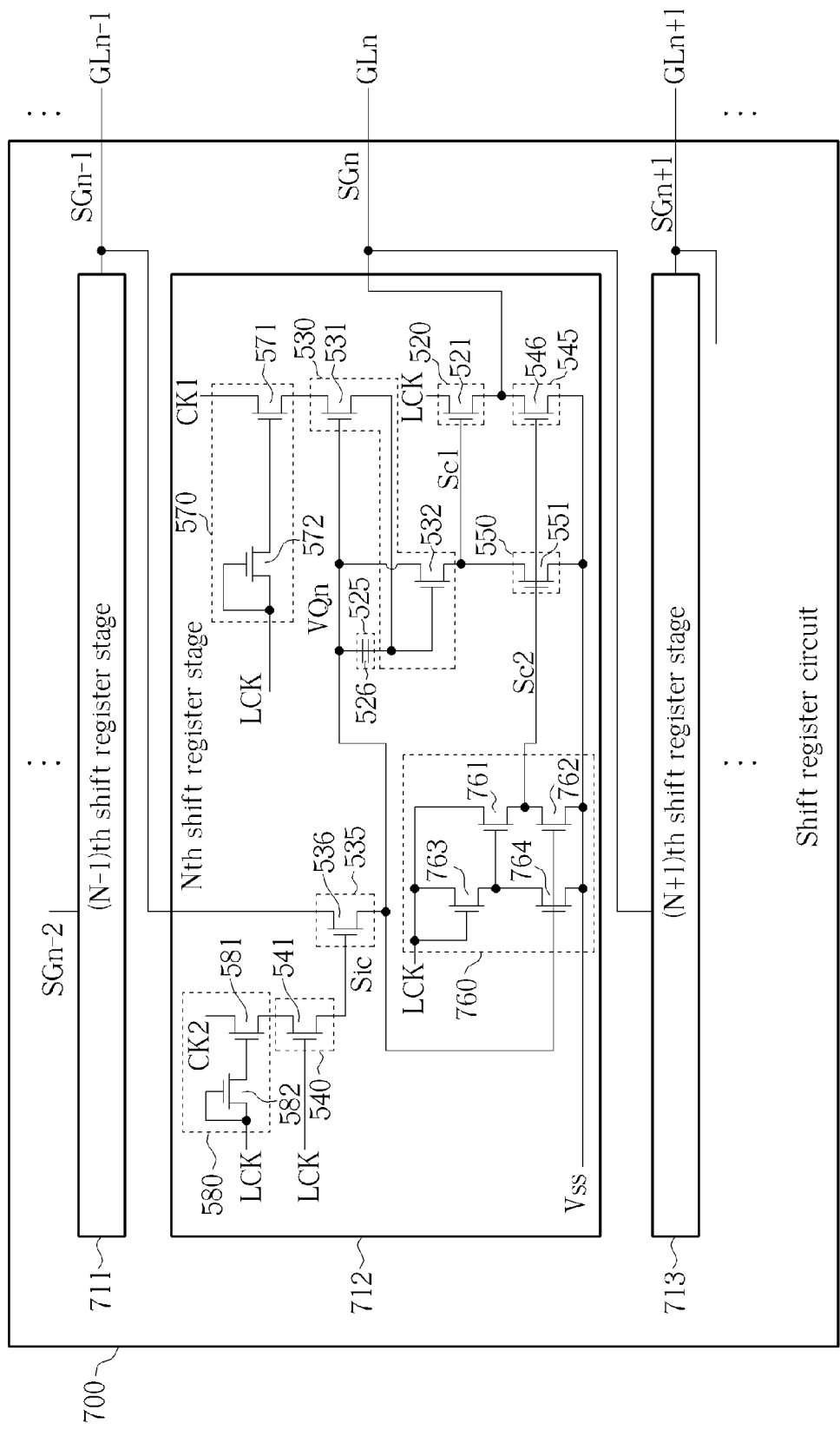
FIG. 7 is a schematic diagram showing a shift register circuit in accordance with a fourth embodiment of the present invention.

FIG. 7 is a schematic diagram showing a shift register circuit in accordance with a fourth embodiment of the present invention. As shown in FIG. 7, the shift register circuit 700 comprises a plurality of shift register stages and, for ease of explanation, illustrates an (N−1)th shift register stage 711, an Nth shift register stage 712 and an (N+1)th shift register stage 713. For the sake of brevity, only the internal structure of the Nth shift register stage 712 is exemplified in detail. The other shift register stages are similar to the Nth shift register stage 712 and can be inferred by analogy. The circuit structure of the Nth shift register stage 712 is similar to that of the Nth shift register stage 512 shown in FIG. 5, differing in that the pull-down control unit 560 is replaced with a pull-down control unit 760.

The pull-down control unit 760 comprises an eighth transistor 761, a ninth transistor 762, a fourteenth transistor 763 and a fifteenth transistor 764. The eighth transistor 761, the ninth transistor 762, the fourteenth transistor 763 and the fifteenth transistor 764 are thin film transistors. The eighth transistor 761 comprises a first end for receiving the low-frequency clock LCK, a second end electrically connected to the gate ends of the sixth transistor 546 and the seventh transistor 551, and a gate end. The ninth transistor 762 comprises a first end electrically connected to the second end of the eighth transistor 761, a second end for receiving the low power voltage Vss, and a gate end electrically connected to the second end of the fourth transistor 536 for receiving the driving control voltage VQn.

The fourteenth transistor 763 comprises a first end for receiving the low-frequency clock LCK, a gate end electrically connected to the first end, and a second end electrically connected to the gate end of the eighth transistor 761. The fifteenth transistor 764 comprises a first end electrically connected to the second end of the fourteenth transistor 763, a second end for receiving the low power voltage Vss, and a gate end electrically connected to the second end of the fourth transistor 536 for receiving the driving control voltage VQn. The fourteenth transistor 763 is employed to forward the low-frequency clock LCK to the gate end of the eighth transistor 761. The fifteenth transistor 764 is utilized for pulling down the voltage at the gate end of the eighth transistor 761 according to the driving control voltage VQn. The signal waveforms regarding the operation of the shift register circuit 700 are substantially identical to the signal waveforms shown in FIG. 6 and, for the sake of brevity, further similar discussion thereof is omitted.

Figure 8:
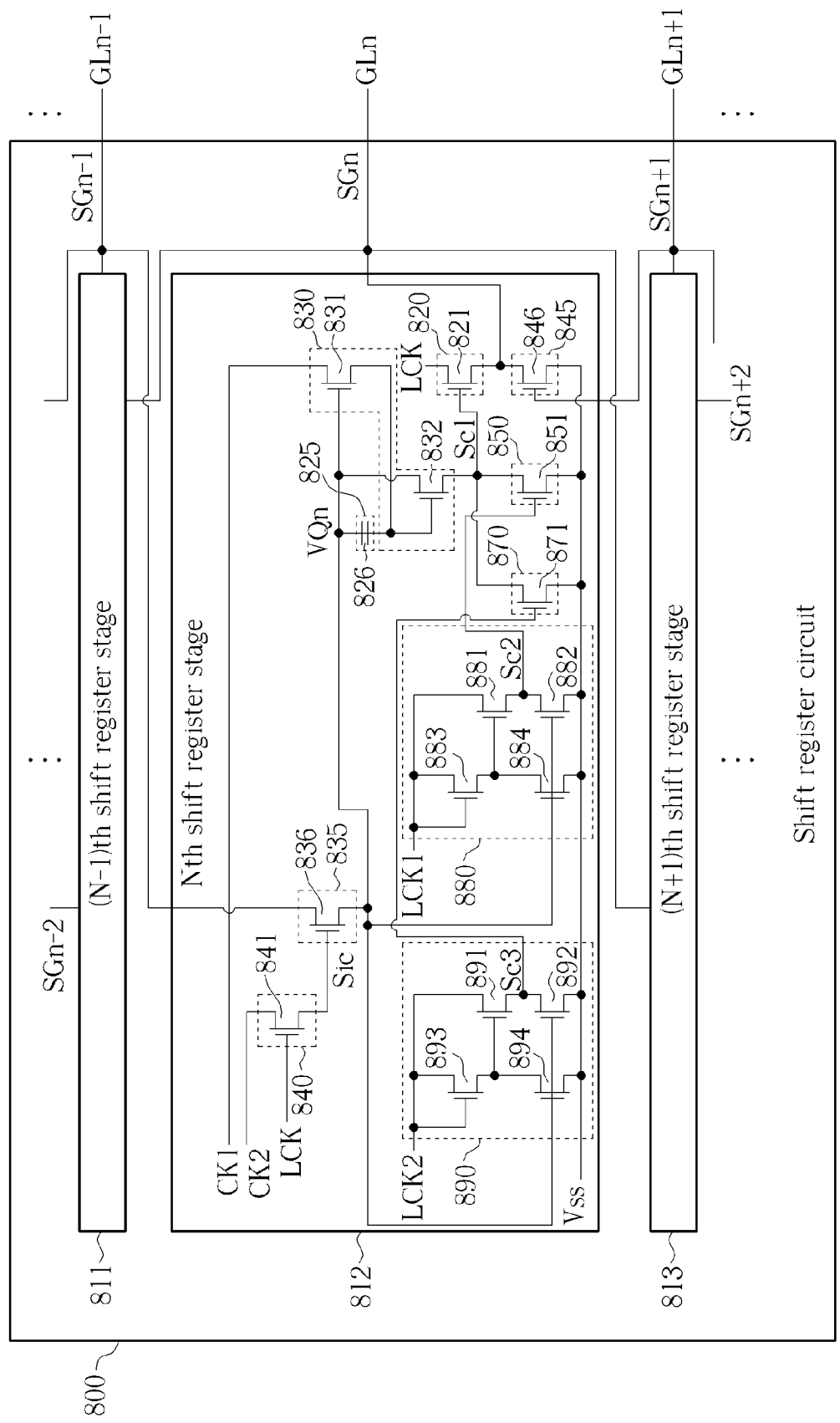
FIG. 8 is a schematic diagram showing a shift register circuit in accordance with a fifth embodiment of the present invention.

FIG. 8 is a schematic diagram showing a shift register circuit in accordance with a fifth embodiment of the present invention. As shown in FIG. 8, the shift register circuit 800 comprises a plurality of shift register stages and, for ease of explanation, illustrates an (N−1)th shift register stage 811, an Nth shift register stage 812 and an (N+1)th shift register stage 813. For the sake of brevity, only the internal structure of the Nth shift register stage 812 is exemplified in detail. The other shift register stages are similar to the Nth shift register stage 812 and can be inferred by analogy. In the operation of the shift register circuit 800, the (N−1)th shift register stage 811 is employed to generate a gate signal SGn−1 furnished to a gate line GLn−1, the Nth shift register stage 812 is employed to generate a gate signal SGn furnished to a gate line GLn, and the (N+1)th shift register stage 813 is employed to generate a gate signal SGn+1 furnished to a gate line GLn+1.

The Nth shift register stage 812 comprises a pull-up unit 820, a pull-up control unit 830, an input unit 835, an input control unit 840, an energy-store unit 825, a first pull-down unit 845, a second pull-down unit 850, a third pull-down unit 870, a first pull-down control unit 880 and a second pull-down control unit 890. The input control unit 840, electrically connected to the input unit 835, is utilized for inputting a second clock CK2 to become an input control signal Sic according to a low-frequency clock LCK. The frequency of the low-frequency clock LCK is less than that of the second clock CK2.

The input unit 835, electrically connected to the (N−1)th shift register stage 811, is utilized for inputting the gate signal SGn−1 to become a driving control voltage VQn according to the input control signal Sic. That is, the gate signal SGn−1 also functions as a start pulse signal for enabling the Nth shift register stage 812. The pull-up control unit 830, electrically connected to the pull-up unit 820, the input unit 835 and the energy-store unit 825, is utilized for generating a first control signal Sc1 according to the driving control voltage VQn and a first clock CK1 having a phase opposite to the second clock CK2. The pull-up unit 820, electrically connected to the gate line GLn, is put in use for pulling up the gate signal SGn of the gate line GLn according to the first control signal Sc1 and the low-frequency clock LCK.

The energy-store unit 825, electrically connected to the input unit 835 and the pull-up control unit 830, functions to perform a charging process or a discharging process based on the gate signal SGn−1. The energy-store unit 825 performs the charging process based on the gate signal SGn−1 when the input unit 835 inputs the gate signal SGn−1 having high-level voltage to become the driving control voltage VQn. Alternatively, the energy-store unit 825 performs the discharging process based on the gate signal SGn−1 when the input unit 835 inputs the gate signal SGn−1 having low-level voltage to become the driving control voltage VQn. For that reason, the aforementioned discharging unit in the prior art is not required to be disposed in the shift register circuit 800 for the purpose of discharging the energy-store unit 825.

The first pull-down unit 845, electrically connected to the gate line GLn and the (N+1)th shift register stage 813, is utilized for pulling down the gate signal SGn according to the gate signal SGn+1. The second pull-down unit 850, electrically connected to the pull-up control unit 830 and the first pull-down control unit 880, is utilized for pulling down the first control signal Sc1 according to a second control signal Sc2. The third pull-down unit 870, electrically connected to the pull-up control unit 830 and the second pull-down control unit 890, is utilized for pulling down the first control signal Sc1 according to a third control signal Sc3.

The first pull-down control unit 880, electrically connected to the input unit 835 and the second pull-down unit 850, is utilized for generating the second control signal Sc2 according to the driving control voltage VQn and a first low-frequency clock LCK1. The frequency of the first low-frequency clock LCK1 is less than that of the first clock CK1. The second pull-down control unit 890, electrically connected to the input unit 835 and the third pull-down unit 870, is utilized for generating the third control signal Sc3 according to the driving control voltage VQn and a second low-frequency clock LCK2 having a phase opposite to the first low-frequency clock LCK1. In view of that, the first pull-down control unit 880 and the second pull-down control unit 890 are employed to drive second pull-down unit 850 and the third pull-down unit 870 for performing an alternate pull-down operation on the first control signal Sc1 so as to prevent long-term high voltage stress occurring to the transistors in the second pull-down unit 850, the third pull-down unit 870, the first pull-down control unit 880 and the second pull-down control unit 890. Accordingly, the threshold voltage shift of the transistors concerned can be avoided for enhancing circuit operation reliability.

In the embodiment shown in FIG. 8, the pull-up unit 820 comprises a first transistor 821, the pull-up control unit 830 comprises a second transistor 831 and a third transistor 832, the input unit 835 comprises a fourth transistor 836, the input control unit 840 comprises a fifth transistor 841, the energy-store unit 825 comprises a capacitor 826, the first pull-down unit 845 comprises a sixth transistor 846, the second pull-down unit 850 comprises a seventh transistor 851, the first pull-down control unit 880 comprises an eighth transistor 881, a ninth transistor 882, a tenth transistor 883 and an eleventh transistor 884, the third pull-down unit 870 comprises a twelfth transistor 871, and the second pull-down control unit 890 comprises a thirteenth transistor 891, a fourteenth transistor 892, a fifteenth transistor 893 and a sixteenth transistor 894. The first transistor 821 through the sixteenth transistor 894 are thin film transistors. The third transistor 832 can be an amorphous-Si thin film transistor. The width/length ratio of the third transistor 832 is larger than the width/length ratios of the seventh transistor 851 and the twelfth transistor 871, i.e. the leakage current of the third transistor 832 is larger than the leakage currents of the seventh transistor 851 and the twelfth transistor 871.

The first transistor 821 comprises a first end for receiving the low-frequency clock LCK, a second end electrically connected to the gate line GLn, and a gate end electrically connected to the pull-up control unit 830. The second transistor 831 comprises a first end for receiving the first clock CK1, a gate end electrically connected to the input unit 835 for receiving the driving control voltage VQn, and a second end. The capacitor 826 is electrically connected between the gate and second ends of the second transistor 831. The third transistor 832 comprises a first end electrically connected to the gate end of the second transistor 831, a second end electrically connected to the gate end of the first transistor 821, and a gate end electrically connected to the second end of the second transistor 831. The fourth transistor 836 comprises a first end electrically connected to the (N−1)th shift register stage 811 for receiving the gate signal SGn−1, a second end electrically connected to the gate end of the second transistor 831, and a gate end electrically connected to the input control unit 840 for receiving the input control signal Sic. The fifth transistor 841 comprises a first end for receiving the second clock CK2, a second end electrically connected to the gate end of the fourth transistor 836, and a gate end for receiving the low-frequency clock LCK. The sixth transistor 846 comprises a first end electrically connected to the gate line GLn, a second end for receiving the low power voltage Vss, and a gate end electrically connected to the (N+1)th shift register stage 813 for receiving the gate signal SGn+1.

The seventh transistor 851 comprises a first end electrically connected to the second end of the third transistor 832, a second end for receiving the low power voltage Vss, and a gate end electrically connected to the first pull-down control unit 880 for receiving the second control signal Sc2. The eighth transistor 881 comprises a first end for receiving the first low-frequency clock LCK1, a second end electrically connected to the gate end of the seventh transistor 851, and a gate end. The ninth transistor 882 comprises a first end electrically connected to the second end of the eighth transistor 881, a second end for receiving the low power voltage Vss, and a gate end electrically connected to the second end of the fourth transistor 836 for receiving the driving control voltage VQn. The tenth transistor 883 comprises a first end for receiving the first low-frequency clock LCK1, a gate end electrically connected to the first end, and a second end electrically connected to the gate end of the eighth transistor 881. The eleventh transistor 884 comprises a first end electrically connected to the second end of the tenth transistor 883, a second end for receiving the low power voltage Vss, and a gate end electrically connected to the second end of the fourth transistor 836 for receiving the driving control voltage VQn.

The twelfth transistor 871 comprises a first end electrically connected to the second end of the third transistor 832, a second end for receiving the low power voltage Vss, and a gate end electrically connected to the second pull-down control unit 890 for receiving the third control signal Sc3. The thirteenth transistor 891 comprises a first end for receiving the second low-frequency clock LCK2, a second end electrically connected to the gate end of the twelfth transistor 871, and a gate end. The fourteenth transistor 892 comprises a first end electrically connected to the second end of the thirteenth transistor 891, a second end for receiving the low power voltage Vss, and a gate end electrically connected to the second end of the fourth transistor 836 for receiving the driving control voltage VQn. The fifteenth transistor 893 comprises a first end for receiving the second low-frequency clock LCK2, a gate end electrically connected to the first end, and a second end electrically connected to the gate end of the thirteenth transistor 891. The sixteenth transistor 894 comprises a first end electrically connected to the second end of the fifteenth transistor 893, a second end for receiving the low power voltage Vss, and a gate end electrically connected to the second end of the fourth transistor 836 for receiving the driving control voltage VQn.

The operation of the shift register circuit 800 is similar to that of the shift register circuit 700 shown in FIG. 7, differing only in that the first and second low-frequency clocks LCK1, LCK2 having phases opposite to each other can be employed to perform an alternate pull-down operation on the first control signal Sc1. That is, except for the additional waveforms of the first and second low-frequency clocks LCK1, LCK2, the waveforms of the low-frequency clock LCK, the first clock CK1, the second clock CK2, the gate signal SGn−1, the gate signal SGn, and the gate signal SGn+1 are substantially identical to those shown in FIG. 6 and, for the sake of brevity, further similar discussion thereof is omitted.

In conclusion, regarding the circuit operation of the shift register circuit according to the present invention, the rising and falling edges of system clock have no effect on the voltage level of the gate signals. That is, when a gate signal is required to continue holding low-level voltage, the gate signal can be stabilized to low-level voltage, i.e. the level drifting phenomena of the gate signal can be prevented, for improving image display quality. Besides, the operation of the clock input units under control of the low-frequency clock is capable of significantly reducing the power consumption of the shift register circuit according to the present invention.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Nth shift register stage of the shift register stages comprising:
   a pull-up unit, electrically connected to an Nth gate line of the gate lines, for pulling up an Nth gate signal of the gate signals according to a first control signal and a low-frequency clock;
   a pull-up control unit, electrically connected to the pull-up unit, for generating the first control signal according to a driving control voltage and a first clock;

a first clock input unit, electrically connected to the pull-up control unit, for inputting the first clock to the pull-up control unit according to the low-frequency clock;
an input unit, electrically connected to the pull-up control unit and an (N−1)th shift register stage of the shift register stages, for inputting an (N−1)th gate signal of the gate signals to become the driving control voltage according to an input control signal;
an input control unit, electrically connected to the input unit, for inputting a second clock to become the input control signal according to the low-frequency clock, wherein the second clock has a phase opposite to the first clock;
a second clock input unit, electrically connected to the input control unit, for inputting the second clock to the input control unit according to the low-frequency clock;
an energy-store unit, electrically connected to the pull-up control unit and the input unit, for performing a charging process or a discharging process based on the (N−1)th gate signal;
a first pull-down unit, electrically connected to the Nth gate line and the pull-up unit, for pulling down the Nth gate signal according to a second control signal;
a pull-down control unit, electrically connected to the input unit for generating the second control signal according to the driving control voltage and the low-frequency clock; and
a second pull-down unit, electrically connected to the pull-down control unit and the pull-up control unit, for pulling down the first control signal according to the second control signal.

2. The shift register circuit of claim 1, wherein:
a frequency of the low-frequency clock is less than a frequency of the first clock.

3. The shift register circuit of claim 1, wherein:
the second clock input unit comprises:
a first transistor comprising a first end for receiving the second clock, a second end electrically connected to the input control unit, and a gate end; and
a second transistor comprising a first end for receiving the low-frequency clock, a gate end electrically connected to the first end of the second transistor, and a second end electrically connected to the gate end of the first transistor;
the input unit comprises a third transistor, the third transistor comprising:
a first end electrically connected to the (N−1)th shift register stage for receiving the (N−1)th gate signal;
a gate end for receiving the input control signal; and
a second end electrically connected to the pull-up control unit, the pull-down control unit and the energy-store unit;
the input control unit comprises a fourth transistor, the fourth transistor comprising:
a first end electrically connected to the second end of the first transistor;
a gate end for receiving the low-frequency clock; and
a second end, electrically connected to the gate end of the third transistor, for providing the input control signal;
the first clock input unit comprises:
a fifth transistor comprising a first end for receiving the first clock, a second end electrically connected to the pull-up control unit, and a gate end; and
a sixth transistor comprising a first end for receiving the low-frequency clock, a gate end electrically connected to the first end of the sixth transistor, and a second end electrically connected to the gate end of the fifth transistor;
the pull-up control unit comprises:
a seventh transistor comprising a first end electrically connected to the second end of the fifth transistor, a gate end electrically connected to the input unit for receiving the driving control voltage, and a second end; and
an eighth transistor comprising a first end electrically connected to the gate end of the seventh transistor, a gate end electrically connected to the second end of the seventh transistor, and a second end electrically connected to the pull-up unit and the second pull-down unit;
the second pull-down unit comprises a ninth transistor, the ninth transistor comprising:
a first end electrically connected to the second end of the eighth transistor;
a gate end electrically connected to the pull-down control unit for receiving the second control signal; and
a second end for receiving a low power voltage; and
the energy-store unit comprises a capacitor electrically connected between the gate and second ends of the seventh transistor.

4. The shift register circuit of claim 3, wherein the eighth transistor is an amorphous-Si thin film transistor, and a width/length ratio of the amorphous-Si thin film transistor is larger than that of the ninth transistor.

5. The shift register circuit of claim 1, wherein:
the pull-up unit comprises a first transistor, the first transistor comprising:
a first end for receiving the low-frequency clock;
a gate end electrically connected to the pull-up control unit for receiving the first control signal; and
a second end electrically connected to the Nth gate line and the first pull-down unit; and
the first pull-down unit comprises a second transistor, the second transistor comprising:
a first end electrically connected to the Nth gate line;
a gate end electrically connected to the pull-down control unit for receiving the second control signal; and
a second end for receiving a low power voltage.

6. The shift register circuit of claim 1, wherein the pull-down control unit comprises:
a first transistor comprising a first end for receiving the low-frequency clock, a gate end electrically connected to the first end, and a second end electrically connected to the first and second pull-down units; and
a second transistor comprising a first end electrically connected to the second end of the first transistor, a gate end electrically connected to the input unit for receiving the driving control voltage, and a second end for receiving a low power voltage.

7. The shift register circuit of claim 1, wherein:
the energy-store unit performs the charging process based on the (N−1)th gate signal when the input unit inputs the (N−1)th gate signal having high voltage level to become the driving control voltage according to the input control signal; and
the energy-store unit performs the discharging process based on the (N−1)th gate signal when the input unit inputs the (N−1)th gate signal having low voltage level to become the driving control voltage according to the input control signal.

* * * * *